March 13, 1962 W. H. SWAIN 3,025,477

FREQUENCY MODULATED OSCILLATOR

Filed Feb. 24, 1959

William H. Swain
INVENTOR.

BY William R. Sherman

ATTORNEY

United States Patent Office 3,025,477

Patented Mar. 13, 1962

3,025,477

FREQUENCY MODULATED OSCILLATOR

William H. Swain, Sarasota, Fla., assignor to Electro-Mechanical Research, Inc., Sarasota, Fla., a corporation of Connecticut Filed Feb. 24, 1959, Ser. No. 795,182

13 Claims. (Cl. 332—30)

This invention relates to oscillators and, more particularly, to oscillators having a resonant wave transmission structure or resonator for determining the frequency of oscillation.

The frequency stability of an oscillator is, for most applications, an important consideration. Where an oscillator is employed to produce a frequency modulated signal in response to a modulating intelligence signal, the importance of frequency stability of the oscillator is particularly evident, since any frequency deviation which does not represent the intelligence to be transmitted results in a corresponding inaccuracy. Thus, where a high degree of accuracy is required as in telemetering data from air-borne instruments by frequency modulated carrier signals, exacting requirements are imposed upon the oscillator. Yet, such oscillators may be operated under adverse conditions of shock, vibration, temperature change and within extreme space limitations.

In past efforts to achieve frequency stability, oscillators have been constructed with resonant transmission lines composed, for example, of Invar, a metal having a low temperature coefficient. However, the frequency determined by such a transmission line was susceptible to variation with changing mechanical and thermal stresses affecting both the Invar and air or gas dielectric enclosed, and the transmission line itself for useful operating frequencies in, say, the VHF range was longer than desirably could be accommodated, for example, in many air-borne applications. In other approaches to the problem, the frequency determining circuit was resonant at a frequency which required multiplication to obtain a carrier in the desired range or channel with the resulting susceptibility to vibrational phase modulation of the carrier and attendant errors in the transmitted intelligence. Where piezoelectric crystals have been employed to determine carrier frequencies in adjacent channels, a multiplicity of crystal elements was required in typical applications. Furthermore, piezoelectric crystal oscillators for FM use characteristically exhibit distortion in the high order side bands.

Accordingly, it is an object of the present invention to provide a new and improved oscillator employing a resonant wave transmission structure for determining the frequency of oscillation with a high degree of stability, yet simple and rugged in form.

Another object of the invention is to provide an oscillator which is highly stable with respect to temperature variations over a wide range and to mechanical stresses including shock and vibration.

A further object of the invention is to provide a frequency modulated oscillator having tuned circuits free of unwanted or uncontrollable impedance poles or zeros close to the operating frequency, whereby the range of high order side bands usable with low distortion is greatly extended.

A further object of the invention is to provide an improved resonant wave transmission structure for an oscillator which is compact in size, readily produced, and simple to maintain in calibration.

These and other objects are attained, in accordance with the invention, by employing as the frequency determining portion of an oscillator, a resonant wave transmission structure having a solid dielectric core composed, for example, of quartz, preferably clear fused quartz or its equivalent, and a conductive film on the core to confine wave energy. The core thus serves both to provide rigid support for the conducting electrical portions of the wave transmission structure and to provide a stable dielectric filling the space intermediate the electrical portions. To produce oscillations at the resonant frequency of the wave transmission structure, an amplifier is coupled with the resonant structure by reactance forming means rigidly secured to the core and electrically connected to the conductive film thereon. The core may be of tubular form with the conductive film defining inner and outer coaxial conductors shorted at one end. In one representative form of the invention a partially isolated portion of the conductive film is disposed for inductive coupling with the wave energy confined within the resonant structure to provide coupling with the amplifier. In another embodiment, coupling with the amplifier is obtained in part by a capacitor, one plate of which is formed by an isolated conductive film on the surface of the dielectric and spaced from the inner conductor in capacitively coupled relation.

The invention, together with others of its objects and advantages, will be better understood from the following detailed description taking reference to the accompanying drawings in which.

Figures 1, 2, 4:
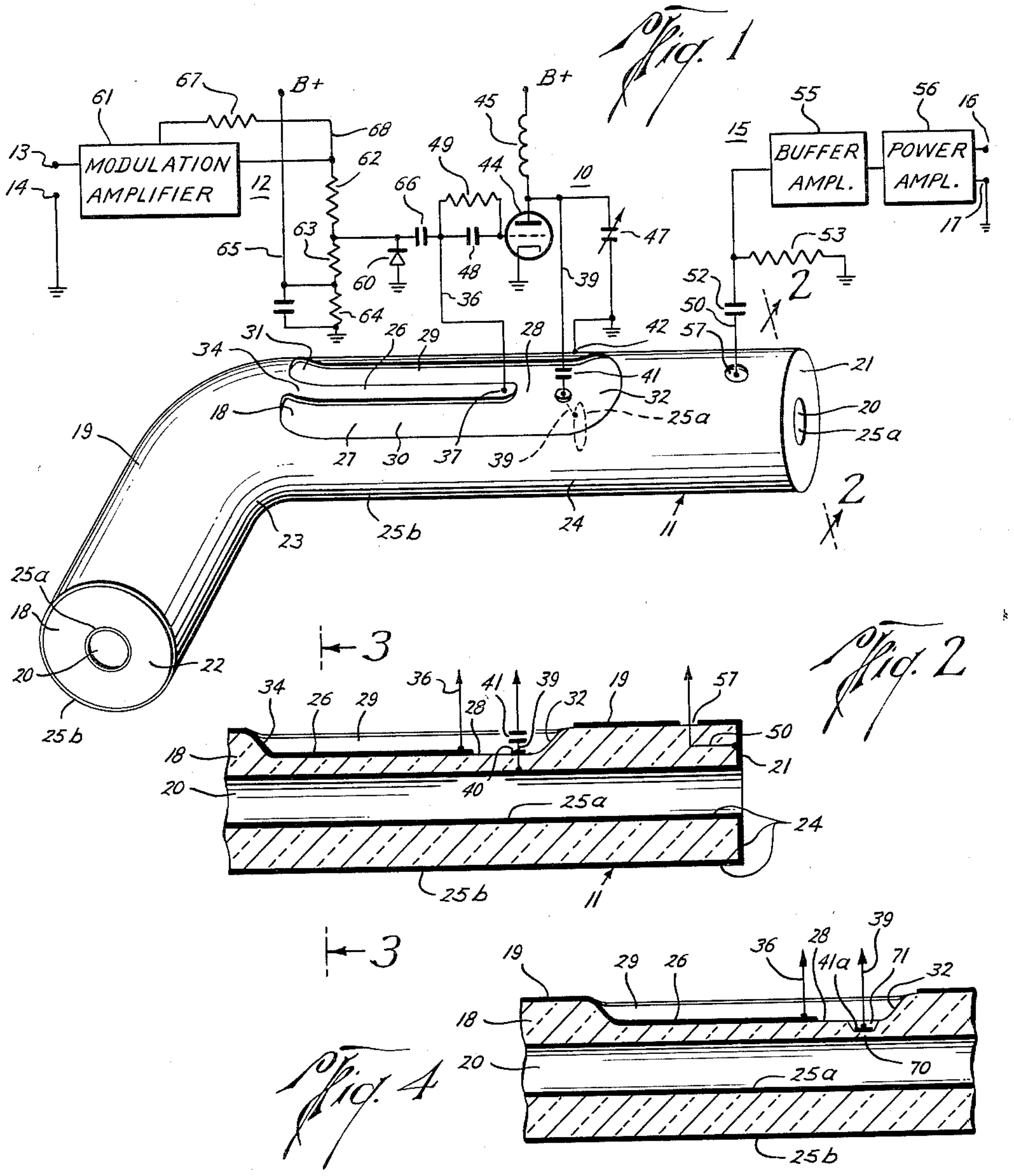
FIG. 1 is a schematic diagram of a representative embodiment of the invention, showing the wave transmission structure in an isometric view.
FIG. 2 is a partial sectional view of the wave transmission structure of FIG. 1 taken along the line II—II of FIG. 1.
FIG. 4 is a cross sectional view, similar to FIG. 2 but rotated slightly about the longitudinal axis to better illustrate top portions, showing a modified embodiment of the invention.

In FIG. 1 is shown an oscillator in accordance with the invention which comprises an amplifier 10, a resonant wave transmission structure or cavity resonator 11, modulating means 12 having input terminals 13, 14 and power output means 15 having output terminals 16, 17. The wave transmission structure or resonator 11 is arranged to be resonant at a given high frequency $f_0$ referred to as the carrier or subcarrier frequency, for example, about 200 megacycles. In the absence of a modulating signal input at terminals 13, 14, a carrier signal is generated at output terminals 16, 17 at the carrier frequency $f_0$ while with a modulating signal input, the output signal is frequency modulated about the carrier frequency in linear correspondence to the input modulation.

The wave transmission structure 11 may be arranged as a quarter-wave resonant coaxial transmission line to which the amplifier 10 is coupled for sustaining oscillations. The resonator structure 11 more particularly comprises a cylindrical core 18 of integral form composed of a solid, non-magnetic dielectric such as quartz, preferably clear fused quartz or an equivalent good dielectric obtained from a single, monolithic ingot. While the core 18 may be in the form of a straight tubular rod having a cylindrical periphery 19 and a cylindrical bore 20 with flat transverse end faces 21 and 22, a variety of forms may suitably be employed. Conveniently, the core is formed with a bend 23 to facilitate more compact design or packaging. The bend 23 may be formed when the quartz rod is at an elevated temperature and is desirably so formed that the core retains through the bend substantially its original circular cross section.

Adherently applied to the outer cylindrical surface 19, the inner cylindrical surface 20 and one end face 21 of the core 18 is a continuous, thin conductive film 24 serving to confine electromagnetic wave energy within the dielectric core 18. The conductive film 24 may be applied and made adherent to the quartz core 18 by any suitable process such as, for example, by immersing the core in the conductive material, either in its molten or solution form, by sputtering, by electrodeposition, by painting, or otherwise, with firing of the film so deposited to insure its permanent adherence, if desired. The composition of the film 24 may be any material exhibiting the desired conductivity and adherence, good results being obtained with metals such as silver, for example. If desired, the second end face 22 may be maintained free of the conductive film during the process of depositing a film on the entire core 18 whereupon the deposit on the end face 22 may be removed by polishing, scraping or the like. Polishing may be employed before the film is applied to obtain a smooth inner surface for the film, if desired, or the core 18 may be chemically roughened for better adhesion of the conducting film. Representative dimensions for the quartz core 18 are, for example, six inches in length, one inch outside diameter and three-eighths inch inside diameter. As illustrated in FIG. 1, one-third the length of the core may conveniently be bent at a right angle to the remaining two-thirds.

The resonant structure 11 thus comprises a coaxial wave transmission line having inner and outer conductors 25*a*, 25*b* formed, respectively, by the portions of the conductive film on the bore 20 and the outer periphery 19, these conductors being rigidly spaced apart by the integral solid dielectric core 18 by which they are solely and entirely supported. The remarkable properties of fused quartz combine to afford an unusual degree of stability to the resonant structure with respect to temperature changes, mechanical stress and vibration, and aging, while permitting the attainment of these noteworthy advantages in a relatively limited space such as is compatible with the packaging requirements of airborne instruments, for example. The thermal stability of fused quartz is unsurpassed by any alternative dielectric material, the thermal coefficient being approximately $0.5\times10^{-6}$ parts/° C. The dielectric stability of fused quartz with aging, temperature, frequency and humidity is excellent. The fused quartz core under any normal service applications is completely rigid and both shock and vibration resistant. In addition, the magnitude of the relative dielectric constant (approximately 4.0) permits the overall length of coaxial line required for a given carrier frequency to be less than half as long as would be required with the conventional use of air as the dielectric, without serious degradation of the unloaded Q of the coaxial line. By way of illustration, a six inch fused quartz line has been found to be entirely satisfactory for operation at approximately 200 mcs.

Figure 3:
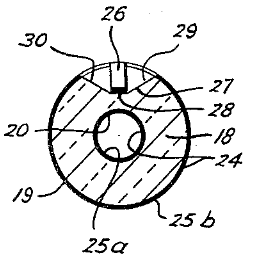
FIG. 3 is a cross sectional view of the wave transmission structure taken along the line III—III of FIG. 2.

To facilitate inductive coupling into the coaxial transmission line 11 without impairing the stable properties characteristic of it, a conductor 26 is provided intermediate the ends of the quartz core and rigidly secured to it. For mutual inductive coupling with current in the inner conductor 21 via the transverse magnetic mode, the conductor 26 extends lengthwise of the core 18 parallel to the bore surface 20 and is spaced inwardly, as best seen in FIG. 2, from the outer conductor 25*b* to define a loop. For example, where the inner and outer diameters of the core 18 are three-eighths inch and one inch respectively, the conductor 26 may lie radially inwardly of the outer diameter a distance of, say, one-fifth inch for satisfactory inductive coupling. To obtain this radially depressed spacing of the conductor 26, a shallow notch 27 is conveniently formed in the outer surface of the core having a relatively flat bottom strip portion 28 along which the conductor 26 extends, as best seen in FIGS. 2 and 3, and obtusely inclined lateral walls 29, 30 and more steeply pitched end walls 31, 32. As best seen in FIG. 1, the conductor 26 is thus in partial electrical isolation with respect to the outer conductive film surface 19 by virtue of the walls 29—32 of bare quartz exposed by the notch 27. However, the conductor is in direct electrical connection with the outer conductor 25*b* at its end 34 which is remote from the short-circuited end 21 of the coaxial transmission line.

The conductor 26 may be formed as a continuation of the conductive film 24 having the shape of a strip extending downwardly from end 34 along the flat bottom portion 28 to a point spaced short of the end wall 32 of the notch 27. Conveniently, the notch is formed, as by flame or torch cutting, or by grinding, and then the strip-like conductor 26 is deposited. Of course, the depositing of the strip-like conductor 26 may be accomplished concurrently with the depositing of the conductive film upon all surfaces of the core 18, subsequent to which bare quartz is exposed in the U-shaped region of the notch 27 defined by lateral walls 29, 30 and end wall 32. A radially extending conductor or lead wire 36 affords connection to the partially isolated end 37 of the inductively coupled conductor 26 to complete a circuit through it forming a partial loop.

To provide a tap along the inner conductor 25*a*, a lead wire 39 is pierced radially through the quartz core 18 in the bottom region 28 of notch 27 spaced opposite conductor end 37, making contact by a solder connection, for example, with the inner conductor 25*a* in bore 20. The lead wire 39 remains insulated from the conductor 26 and the outer conductor 25*b*. In the embodiment of FIGS. 1–3, the lead wire 39 serves rigidly to support a coupling capacitor 41 having connection with the amplifier portion of the oscillator in a manner next to be described.

Of the wide variety of oscillator circuits with which the wave transmission structure 11 of this invention may be employed, the circuit illustrated in FIG. 1 is exemplary in its simple and reliable operation. An amplifying device 44, which may be a triode type electronic vacuum tube having an anode, cathode and control grid, has a choke inductance coil 45 in its anode circuit connecting the anode with the B+ terminal of the anode current supply and its cathode grounded. Grounding may be accomplished, for example, by connection to a chassis or simply by connection to the outer conductor 25*b* of the resonant line 11 at intermediate point 42, which is also shown to be grounded. The anode of amplifying device 44 is also connected via coupling capacitor 41 to the inner conductor 25*a* via lead 39. An adjustable capacitor 47 may be connected in parallel between the anode and ground for purposes of fine frequency adjustment, if desired. The capacity added by capacitor 47 will also reduce drift due to amplifying device 44.

To provide grid feedback from the resonant line 11, the partially isolated end 37 of conductor 26 is connected via lead 36 and capacitor 48 in parallel with grid resistor 49 to the control electrode of the amplifying device.

Operationally, the oscillator thus described resembles a Hartley circuit with anode to grid coupling via the high-impedance resonant coaxial line 11. The resulting oscillations are substantially at the resonant frequency of the coaxial line determined accurately and stably as a result of its integral quartz core and conductive film construction. By employing the small anode coupling capacitor 41, a reactance versus frequency characteristic is obtained similar to that of a Clapp-type oscillator circuit. In consequence of the high rate of change of phase with frequency around the closed loop, a very stable operating point is obtained, whereby errors due to tube or other parameter changes are reduced. At the same time, the oscillator exhibits a freedom from distortion when frequency modulated whereby effective use may be made of at least third order side bands for at least a one megacycle modulation input signal.

With the inductively coupled conductor 26 having direct connection with the outer conductor 25*b* at its end remote from the short-circuited end 21 of the coaxial line, a central placement of amplifying tube 44 along the line is permitted. Leads such as 36 and 39 may thus be short and direct, with correct phasing conveniently afforded for sustaining regeneration or oscillation in a highly stable manner.

One manner of deriving an output signal from the oscillator is illustrated in FIGS. 1 and 2 to comprise a length of conductor or lead wire 50 having a termination in the conductive end face 21 intermediate the inner and outer diameters and extending longitudinally for a small distance short of the notch 27. There lead 50 turns radially outwardly for connection via coupling capacitor 52 and grid resistor 53 to the input of cascaded buffer and power amplifiers 55, 56. In region 57 immediately adjacent the point at which lead 50 emerges from the quartz core 18, the core is bare of any conductive film to leave the lead 50 insulated from the outer conductor 25*b*. By snuggly imbedding the inductively coupled loop portion of lead 50 within the quartz core, its mutual coupling with respect to the transverse magnetic mode remains constant and stable at a relatively small value. The output circuitry thus imposes a minimum, substantially constant loading upon the oscillator.

In many applications, it is desirable to frequency modulate the oscillator output, preferably with a linear relationship between frequency deviation and a modulating signal throughout a range such as plus and minus 0.1 percent to one percent of the carrier frequency. This frequency modulation may be accomplished directly, in accordance with the present invention, by driving a modulating diode 60 with the output of the modulation amplifier 61 coupled via potential dividing resistors 62—64. By connecting the junction of resistors 63, 64 via lead 65 with the B+ power supply terminal, diode 60 is biased in the reverse direction in a range wherein its incremental or transition capacity varies roughly linear in proportion to the amplified version of the modulation input signal applied to terminals 13, 14. The ungrounded terminal of diode 60 may be coupled by a small dividing capacitor 66 with the isolated end 37 of inductive conductor 26. To compensate for shifts in the diode operating point arising from temperature changes, it may be desirable to employ a feedback loop including resistor 67 connected by lead 68 between the output and input of the modulation amplifier 61.

As will be readily understood, variations in the effective capacity of diode 60 with change in the modulation input at terminals 13, 14 proportionately increase or decrease the reactive effect of conductor 26 on the quartz line resonator, thereby changing the frequency of oscillation to a corresponding extent. A high degree of direct frequency modulation has thus been realized.

It will be appreciated, of course, that just as other oscillator circuits may be employed with the resonant line 11, so different forms of effecting modulation may be employed, as desired.

In a further modification illustrated in FIG. 4 a "printed" anode coupling capacitor is provided. As shown, lead 39 terminates in a conductive surface film 41*a* defining a probe of limited area spaced opposite the inner conductor 25*a* by a portion 70 of the solid dielectric core 18. The conductive film 41*a* forming the probe or outer plate of the capacitor may be deposited within a generally circular depression formed in the bottom of the notch 27 intermediate conductor 26 and end wall 32, so that the dielectric spacing provided by portion 70 is relatively small.

While the modified coupling capacitor is not as simple to assembly as is capacitor 41, its more rigid positioning with respect to the resonant structure 11 insures a higher degree of stability under varying conditions.

It may be noted that, in lieu of the form of conductor 26 shown in FIGS. 1–3, a lead wire similar to wire 50 of FIG. 2 may be disposed within an unnotched bare portion of the quartz core 18 with similar dimensions and connections as illustrated for conductor 26 to provide inductive coupling for the same purpose. If desired, the resonant line 11 may have both end faces 21 and 22 conductively coated while an annular gap bare of any conductive coating is provided along inner conductor 25*a* a predetermined distance in from end face 22. Such gap may be formed, for example, by selectively grinding a short annular region of bore 20 after the entire core 18 has been coated with conductive film 24. The resonant frequency of the line 11 may then be varied with the same dimensions of core 18 by forming the gap at different, relatively short spacings from end face 22. The short-circuiting of end face 22 at the same time provides a shield against end effects.

Other variations in the form and application of the resonator and in the circuitry associated with it will occur to those skilled in the art. Accordingly, the invention is not to be limited to the embodiments illustrated and described but is of a scope defined in the appended claims.

I claim:

1. A coaxial wave transmission line comprising a solid tubular core composed of monolithic fused quartz, and a conductive film adherently covering substantially the entire surface of said core including the inner and outer concentric surfaces thereof to provide inner and outer coaxial conductors, said film having an annular discontinuity providing an open-circuit in said line to determine its resonant frequency and having a localized discontinuity on said outer concentric surface to permit coupling interiorly of said core.

2. A coaxial wave transmission line comprising a solid tubular core composed of monolithic fused quartz, and a conductive film adherently covering substantially the entire surface of said core including the inner and outer concentric surfaces thereof to provide inner and outer coaxial conductors, said film having an annular discontinuity providing an open-circuit in said line to determine its resonant frequency and having a localized discontinuity on said outer concentric surface to permit coupling interiorly of said core, a portion of said film isolated by said localized discontinuity being adherent on a depressed portion of said core for capacitive coupling into said core.

3. A coaxial wave transmission line comprising a solid tubular core composed of monolithic fused quartz, a conductive film adherently covering substantially the entire surface of said core including the inner and outer concentric surfaces thereof to provide inner and outer coaxial conductors and at least one end of said core, said film having an annular discontinuity providing an open-circuit in said line to determine its resonant frequency and having a localized discontinuity on said outer concentric surface to permit coupling interiorly of said core, and a conductor imbedded in said core and extending lengthwise thereof from electrical contact with the conductive film at said one end and spaced intermediate said inner and outer concentric surfaces to a point opposite said localized discontinuity and extending outwardly through said localized discontinuity in electrical isolation from said film thereabout.

4. A coaxial wave transmission line comprising a solid tubular core composed of monolithic fused quartz, a conductive film adherently covering substantially the entire surface of said core including the inner and outer concentric surfaces thereof to provide inner and outer coaxial conductors, said film having an annular discontinuity providing an open-circuit in said line to determine its resonant frequency and having a localized discontinuity on said outer concentric surface to permit coupling interiorly of said core, a conductor extending inwardly of the profile of said core to define an inductive coupling loop and having one end terminating in said localized discontinuity so as to be at least partially isolated from said conductive film, and a semiconductor diode coupled between the electrically isolated end of said coupling conductor and said outer conductor, means for reversely biasing said diode to provide variations in its transition capacity, and means for applying a modulating signal varying in amplitude to said diode to produce a corresponding reactance change in said line.

5. The combination comprising a resonant wave transmission line having a tubular core composed of a solid dielectric and coaxial inner and outer conductors adherently covering substantially the entire inner and outer surfaces, respectively, of said core to confine wave energy within said core, means for effectively short-circuiting said inner and outer conductors at one end of said core, a conductor extending lengthwise of said core and supported by said core in inwardly spaced relation with respect to said outer conductor for mutual inductive coupling with said wave energy, said inductively coupled conductor being electrically connected with said outer conductor at its end remote from said short-circuited end and spaced in electrically insulated relation from said outer conductor along its length and at its opposite end.

6. A resonator for use in an oscillator comprising a resonant coaxial line having an integral tubular core composed of quartz and including inner and outer conductors formed as conductive films adherently covering substantially the entire inner and outer concentric portions, respectively, of said core to confine wave energy therewithin, a conductive film on one end face of said core for short-circuiting the corresponding ends of said inner and outer conductors, said core having a notch formed in the exterior surface thereof and extending longitudinally intermediate the ends of said core, a conductive strip extending along the bottom of said notch in parallel proximity to said inner conductor for mutual inductive coupling therewith and connecting continuously with said outer conductor at its end opposite the short-circuited end of said outer conductor, said strip being spaced in insulated relation from said outer conductor along its length and at said opposite end, and a coupling capacitor electrically isolated from said outer conductor and directly connected with said inner conductor intermediate its length.

7. A resonator, as defined in claim 6, wherein said coupling capacitor has one plate formed as a localized conductive film spaced in insulated relation from said outer conductor and said inductive strip and spaced by a portion of said quartz core from said inner conductor for capacitive coupling therewith.

8. The combination comprising a resonant coaxial line having an integral tubular core composed of a solid dielectric and including inner and outer conductors formed as conductive films covering substantially the entire inner and outer concentric surfaces, respectively, of said core for confining wave energy within said core, and a conductive film on one end face of said core for short-circuiting the corresponding ends of said inner and outer conductor, and means including a conductor extending into said core lengthwise from the conductive film on said end face and thence radially outwardly from said core for mutual inductive coupling with said inner conductor to derive an output signal from said coaxial line.

9. An oscillator comprising a resonant coaxial line having an integral tubular core composed of a solid dielectric and including inner and outer conductors formed by conductive films substantially covering the inner and outer concentric surfaces of said core, respectively, to confine wave energy therein, and a conductive film on an end face of said core in conductive contact with the corresponding ends of said inner and outer conductors, a coupling conductor extending lengthwise of said core from a connection with said outer conductor intermediate its ends and otherwise spaced in insulated relation from said outer conductor and inwardly toward said inner conductor for mutual inductive coupling therewith, a coupling capacitor connected with said inner conductor intermediate its length and insulated from said outer conductor, and an amplifying device including an anode inductively coupled with a positively supply terminal and capacitively coupled by said capacitor with said inner conductor intermediate its length, a cathode connected to said outer conductor intermediate its length, and a control electrode coupled with the electrically isolated end of said coupling conductor for producing oscillations substantially at the resonant frequency of said coaxial line.

10. An oscillator as defined in claim 9 including diode means coupled with the electrically isolated end of said coupling conductor for deviating the frequency of oscillations as a function of a modulating signal.

11. An oscillator as defined in claim 9 including a silicon junction diode coupled between the electrically isolated end of said coupling conductor and said outer conductor, means for reversely biasing said diode to permit variations in its transition capacity, and means for applying a modulating signal varying in amplitude to said diode to produce proportional deviations in the frequency of said oscillations.

12. A cavity resonator comprising a monolithic cylindrical core composed of a solid dielectric, and a conductive film adherently covering substantially the entire surface of said core for confining wave energy therein, a portion of said film at least partially isolated by an exposed portion of said core and covering a depressed portion of said core for coupling with said wave energy.

13. A cavity resonator comprising a monolithic cylindrical core composed of a solid dielectric, and a conductive film adherently covering substantially the entire surface of said core for confining wave energy therein, a strip-like portion of said film having its length and only one end isolated by an exposed depressed portion of said core for inductive coupling with wave energy therein, and a second portion of said film surrounded by an exposed depressed portion of said core for coupling wave energy into said core.

References Cited in the file of this patent

UNITED STATES PATENTS

| | | |
|---|---|---|
| 2,169,305 | Tunick | Aug. 15, 1939 |
| 2,281,247 | Peterson | Apr. 28, 1942 |
| 2,442,615 | Percival | June 1, 1948 |
| 2,704,830 | Rosencrans | Mar. 22, 1955 |
| 2,779,925 | Black | Jan. 29, 1957 |
| 2,860,248 | Lyman | Nov. 11, 1958 |